(12) United States Patent
Bolocan et al.

(10) Patent No.: US 11,906,559 B2
(45) Date of Patent: Feb. 20, 2024

(54) ENHANCED IMPEDANCE MEASUREMENT USING CTMU

(71) Applicant: Microchip Technology Incorporated, Chandler, AZ (US)

(72) Inventors: Bogdan Bolocan, Eggenstein-Leopoldshafen (DE); Ezana Haile, Chandler, AZ (US); Pat Richards, Peoria, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 17/839,964

(22) Filed: Jun. 14, 2022

(65) Prior Publication Data

US 2022/0413025 A1 Dec. 29, 2022

Related U.S. Application Data

(60) Provisional application No. 63/214,599, filed on Jun. 24, 2021.

(51) Int. Cl.
*G01R 27/28* (2006.01)
*G01R 27/02* (2006.01)
(Continued)

(52) U.S. Cl.
CPC ........... *G01R 27/02* (2013.01); *G01N 27/223* (2013.01); *G01R 27/28* (2013.01); *G01R 27/32* (2013.01); *H04B 3/46* (2013.01); *H04B 17/0085* (2013.01); *H04B 17/103* (2015.01)

(58) Field of Classification Search
CPC ........ G01R 27/02; G01R 27/28; G01R 27/32; G01N 27/223; H04B 3/46; H04B 17/0085; H04B 17/103
(Continued)

(56) References Cited

U.S. PATENT DOCUMENTS

| 7,764,213 B2 | 7/2010 | Bartling et al. ............. 341/152 |
| 2003/0030451 A1* | 2/2003 | Braun .................... G01R 27/02 324/678 |

(Continued)

OTHER PUBLICATIONS

Yedamale, Padmaraja et al., "AN1375: See What You Can Do with the CTMU," Microchip Technology Incorporated, URL: https://www.microchip.com/content/dam/mchp/documents/parked-documents/2001375a.pdf, 12 pages, May 11, 2011.

(Continued)

*Primary Examiner* — Raul J Rios Russo
(74) *Attorney, Agent, or Firm* — SLAYDEN GRUBERT BEARD PLLC

(57) ABSTRACT

A method and apparatus for measuring an unknown impedance. The apparatus comprises a first input to receive a first signal generated by a first portion of a sensor circuit, the first portion comprising an unknown impedance and a first known resistance, the unknown impedance to vary based upon a phenomenon to be measured by the sensor circuit. The apparatus also comprises a second input to receive a second signal generated by a second portion of the sensor circuit, the second portion of the sensor circuit comprising a known impedance and a second known resistance. And the apparatus comprises control logic to, based on a difference in time at which each of the first input and the second input reach a reference voltage, determine a measurement of the sensor circuit.

20 Claims, 9 Drawing Sheets

(51) Int. Cl.
    *G01N 27/22*     (2006.01)
    *G01R 27/32*     (2006.01)
    *H04B 3/46*     (2015.01)
    *H04B 17/00*     (2015.01)
    *H04B 17/10*     (2015.01)

(58) Field of Classification Search
    USPC ........... 324/76.11–76.83, 459, 600, 649, 650
    See application file for complete search history.

(56) References Cited

U.S. PATENT DOCUMENTS

| | | | |
|---|---|---|---|
| 2007/0182426 A1* | 8/2007 | Hocker | G01R 27/02 |
| | | | 73/1.06 |
| 2013/0234727 A1* | 9/2013 | Baker | G11C 11/1659 |
| | | | 324/617 |
| 2015/0219703 A1* | 8/2015 | Geuther | H03K 17/955 |
| | | | 324/686 |
| 2015/0293155 A1 | 10/2015 | Joet et al. | 324/706 |
| 2018/0321186 A1* | 11/2018 | Looney | G01N 27/404 |
| 2019/0204365 A1 | 7/2019 | Bertin et al. | |

OTHER PUBLICATIONS

Yu, Yu-Hsiang et al., "A Pseudo-Differential Measuring Approach for Implementing Microcontroller-Based Capacitive Touch Sensing in Low-Power Quality Situation," IEEE Sensors Journal, vol. 16, No. 2, pp. 390-399, Jan. 15, 2016.

International Search Report and Written Opinion, Application No. PCT/US2022/034218, 12 pages, dated Oct. 13, 2022.

* cited by examiner

ENHANCED IMPEDANCE MEASUREMENT USING CTMU

This application claims priority to U.S. provisional patent application Ser. No. 63/214,599 filed Jun. 24, 2021, the contents of which are herein incorporated by reference in their entirety.

FIELD OF THE INVENTION

The present application relates to impedance measurements and instrumentation and, more particularly, to enhanced impedance measurement using a charge time measurement unit (CTMU).

BACKGROUND

Existing measurements using CTMU of an unknown impedance may use absolute measurements. These methods cannot easily determine the impedance value due to variations in measurement conditions.

SUMMARY

Examples of the present disclosure include an apparatus for measuring an unknown impedance. The apparatus comprises a first input to receive a first signal generated by a first portion of a sensor circuit, the first portion comprising an unknown impedance and a first known resistance, the unknown impedance to vary based upon a phenomenon to be measured by the sensor circuit. The apparatus also comprises a second input to receive a second signal generated by a second portion of the sensor circuit, the second portion of the sensor circuit comprising a known impedance and a second known resistance. And the apparatus comprises control logic to, based on a difference in time at which each of the first input and the second input reach a reference voltage, determine a measurement of the sensor circuit.

In certain examples, the control logic is to, in order to determine the measurement of the sensor circuit based on the difference of time at which each of the first input and the second input reach the reference voltage, based on a determination that the second input has reached the reference voltage, apply a current source or sink to a reference capacitor; based on a determination that the first input has reached the reference voltage, remove the current source or sink from the reference capacitor; and determine the measurement of the sensor circuit based upon a voltage of the reference capacitor after application then removal of the current source or sink to the reference capacitor. In certain examples, the control logic is to, in order to determine the measurement of the sensor circuit based on the difference of time at which each of the first input and the second input reach the reference voltage, cause an analog to digital converter to measure the voltage of the reference capacitor. In certain examples, the hold time to determine the voltage of the reference capacitor is independent of the time the current source or sink was applied to the reference capacitor. In certain examples, the unknown impedance is a variable capacitor with an unknown capacitance to vary based upon the phenomenon to be measured; the first known resistance is coupled to a ground; the known impedance is a reference capacitor with a fixed capacitance; and the second known resistance is coupled to the ground. In certain examples, the difference in time at which each of the first input and the second input reach the reference voltage is based upon difference in the unknown capacitance and the fixed capacitance. In certain examples, the control logic is to issue a sensor input voltage to the sensor circuit to cause the first signal and the second signal to change to reach the reference voltage. In certain examples, the control logic is to issue the sensor input voltage to the sensor circuit to cause the sensor circuit to begin charging or discharging the variable capacitor to generate the first signal; and begin charging or discharging a sensor reference capacitance to generate the second signal.

Examples of the present disclosure include a method for measuring an unknown and variable impedance comprising receiving a first signal generated by a first portion of a sensor circuit, the first portion comprising an unknown impedance and a first known resistance, the unknown impedance to vary based upon a phenomenon to be measured, receiving a second signal generated by a second portion of the sensor circuit, the second portion comprising a known impedance and a second known resistance, determining, based on a difference in time at which each of the first signal and the second signal reach a reference voltage, a measurement of the sensor circuit.

In certain examples of the method, when either the first signal or the second signal reaches the reference voltage, begin applying a current source with a known current to a timing capacitor with a known capacitance; and when the other of the first signal or the second signal reaches the reference voltage, terminate application of the current source to the timing capacitor; wherein the step of determining a measurement of the sensor circuit is based on the resultant voltage of the timing capacitor. In certain examples the method further comprises measuring a voltage of the timing capacitor in order to determine the measurement of the sensor circuit based on the difference of time at which each of the first input and the second input reach the reference voltage. In certain examples of the method, the hold time for measuring the voltage of the timing capacitor is independent of the time the current source was applied to the timing capacitor. In certain examples of the method, the unknown impedance is a variable capacitor with an unknown capacitance to vary based upon the phenomenon to be measured; the first known resistance is coupled to a ground; the known impedance is a reference capacitor with a fixed capacitance; and the second known resistance is coupled to the ground. In certain examples of the method, the difference in time at which each of the first input and the second input reach the reference voltage is based upon difference in the unknown capacitance and the fixed capacitance. In certain examples, the method further comprises issuing a sensor input voltage to the sensor circuit to cause the first signal and the second signal to change to reach the reference voltage. In certain examples of the method the unknown impedance is a variable capacitor with an unknown capacitance to vary based upon the phenomenon to be measured. In these examples, the method further comprises begin charging or discharging the variable capacitor to generate the first signal, the variable capacitor to vary based upon the phenomenon to be measured by the sensor circuit; and begin charging or discharging a sensor reference capacitance to generate the second signal.

Examples of the present disclosure include a sensing apparatus to measure a phenomenon. The apparatus comprises a voltage input to receive an input direct current (DC) voltage; and a bridge sensor circuit. The bridge sensor circuit further includes a first bridge leg circuit including a variable impedance component, the variable impedance component including an unknown impedance to vary based upon the phenomenon coupled at a first output to a first reference resistance connected in series with the variable impedance component, and a second bridge leg circuit including a reference impedance component including a reference impedance coupled at a second output to a second reference resistance connected in series with the reference impedance component. The apparatus further comprises a first comparator coupled to the first output and a reference voltage; and a second comparator coupled to the second output and the reference voltage; wherein a combination of an output of the first comparator and an output of the second comparator are to represent a measurement of the phenomenon.

In certain examples, the variable impedance component is a variable capacitor, the first reference resistance is connected in series between the variable capacitor and ground, the reference impedance component is a reference capacitor, and the second reference resistance is connected in series between the reference capacitor and ground. In certain examples, the output of the first comparator is coupled to a timing circuit, the output of the second comparator is coupled to the timing circuit, and the timing circuit is measuring a time between a first change in one of the two comparator outputs and a second change in the other of the two comparator outputs, wherein the time represents a measurement of the phenomenon.

Examples of the present disclosure include a sensor with a bridge configuration and to provide two voltages to a CTMU. The CTMU may be to charge a reference capacitor with a current source based upon the two voltages from the sensor. The charge of the reference capacitor may be used to determine the signal sensed by the sensor.

DETAILED DESCRIPTION

Figure 1:
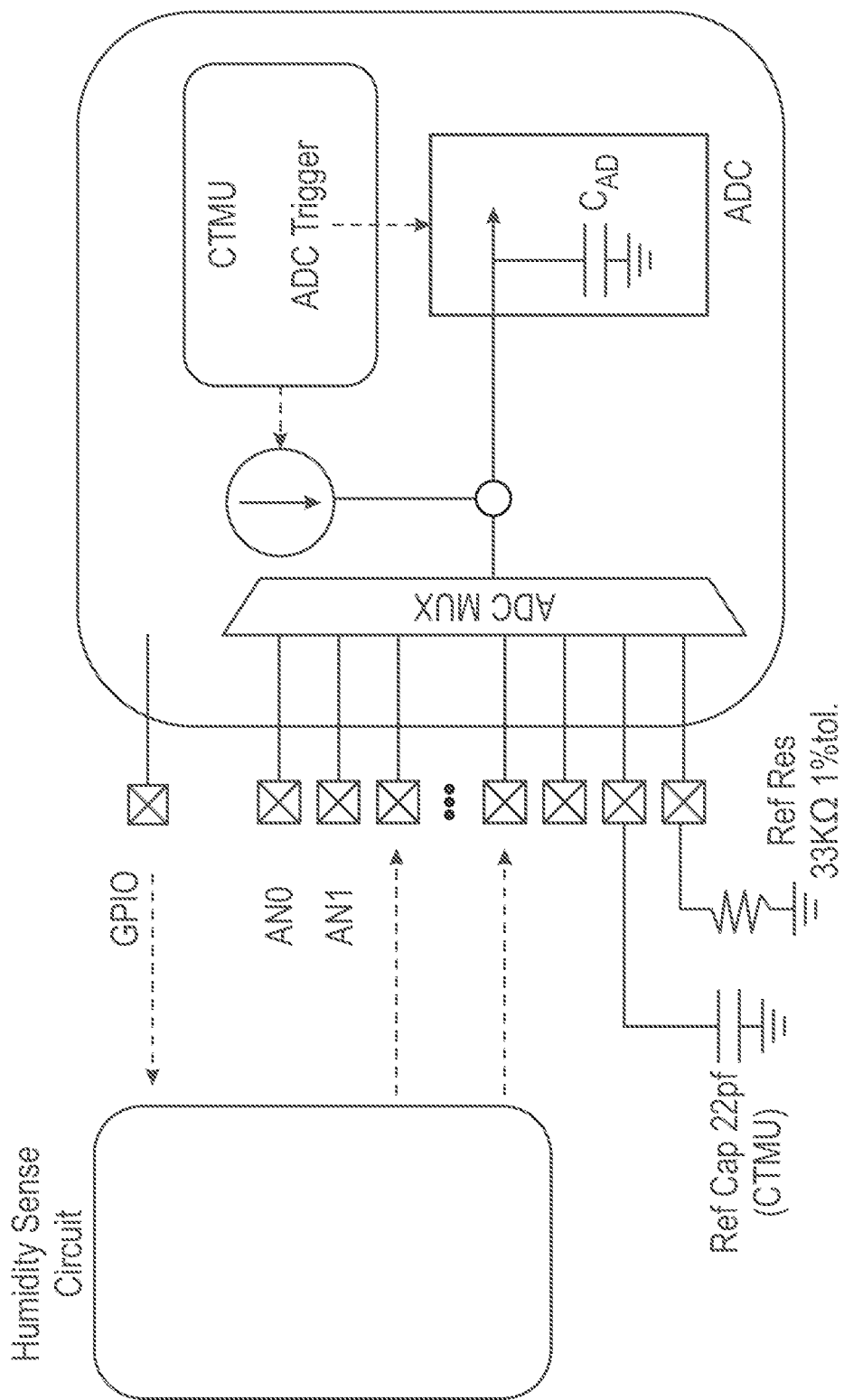
FIG. 1 is an illustration of an example system for impedance measurement using a CTMU, according to examples of the present disclosure.

FIG. 1 is an illustration of an example system for impedance measurement using a CTMU, according to examples of the present disclosure. The example system provides a solution for high precision measurement of an unknown reactive element in a simple circuit using cost-effective components. In particular, this system uses a stimulus function to drive the circuit with the unknown reactive element and to drive a second circuit with a known reactive element. Each circuit will begin changing voltage at a rate indicative of the reactance of that circuit. Once either circuit reaches a reference voltage the example system starts charging or discharging a timing capacitor. The example system stops charging or discharging the timing capacitor once the other of the two circuits reaches the reference voltage. The CTMU is then used to measure the accumulated charge and determine the reactance of the unknown reactive element.

The sensor may provide an impedance that is to be measured by the microcontroller. The impedance may be of any suitable form, such as by resistance, capacitance, inductance, or a combination thereof. The sensor may measure any suitable phenomena, such as an environmental sensor sensing humidity. The change in the phenomena may be correlated with a change in or absolute value of impedance of the sensor. The microcontroller may determine, from the change in or absolute value of the impedance of the sensor, the phenomena that is to be measured. In one example, an inductive proximity sensor may present a varying inductance indicating the proximity of the sensor to, for example, metal objects. In another example, an inductive position sensor may present a varying inductance indicating the position of a metallic object relative to the position sensor. In another example, a potentiometer may present a varying resistance indicating the position of a slider or rotation of a knob. The sensor The microcontroller may include any suitable number and kind of ports or pins. These may be used to interface with instrumentation, the sensor, or other elements. For example, the microcontroller may include a general-purpose input and output (GPIO) port. The microcontroller may include any suitable number of analog input or output (AN) ports. The microcontroller may be connected to or may include a reference capacitor port to connect to a reference capacitor. The value of the reference capacitor may be 22 pF and may be referred to as CCTMU. The microcontroller may be connected to or may include a reference resistor port to connect to a reference resistor. The value of the reference resistor may be 33 kiloohms with a 1% variation.

The microcontroller may include a CTMU circuit. The CTMU circuit may be a peripheral of the microcontroller, wherein the CTMU circuit operates independently of a processor, once initiated with operating parameters. The CTMU circuit may be implemented by analog circuitry, digital circuitry, instructions for execution by a processor, or any combination thereof.

The CTMU circuit may include control logic to perform various tasks. The CTMU circuit may operate a current source or a current sink (not shown). The current source, when enabled, may charge capacitors. The current source may be disabled and stop charging such capacitors. The CTMU circuit may, after starting then stopping the charging of the capacitors, measure the charge of the capacitors. The CTMU circuit may discharge the capacitors after such measurements are made. The length of time that the capacitors are charged may be made according to impedance signals provided by the sensor. The impedance signals may be manifested by analog voltage signals. The analog voltage signals may be compared against a reference voltage to determine when to start and stop charging the capacitors. The charge on the capacitors, after such starting and stopping, may thus be proportional or otherwise indicative of the impedance signals of the sensor, which in turn may reflect the phenomena to be measured by the sensor.

Any suitable capacitors may be charged. For example, an analog to digital (AD) conversion (ADC) capacitor, $C_{AD}$, may be charged. Moreover, reference capacitor $C_{CTMU}$ may be connected in parallel to $C_{AD}$ to provide a larger value of capacitance to be charged. In this example, $C_{AD}$ and $C_{CTMU}$ may be connected in parallel and act as a single, larger reference capacitor whose capacitance is known.

In one example, the CTMU circuit may apply the current source to $C_{AD}$, $C_{CTMU}$, and the reference resistor to precisely determine the value of the impedances of these components. This may be done in, for example, a calibration mode. This may be performed periodically, upon startup, or upon demand by the microcontroller, software therein, or a user thereof.

In some examples, not shown, a current sink rather than a current source may be used. In such examples, the current sink may be placed between the reference capacitors and ground, and a constant voltage source applied to the reference capacitors.

Figure 2:
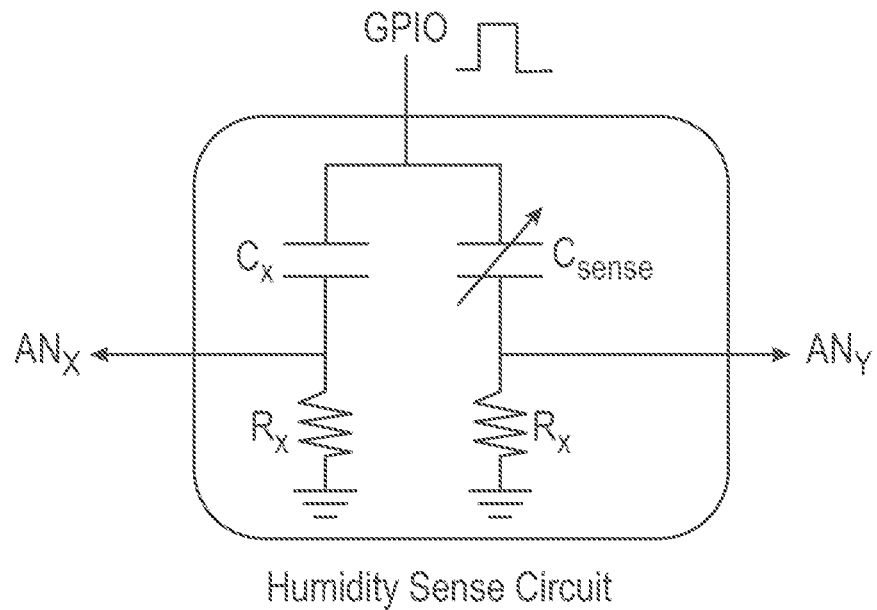
FIG. 2 is an illustration of an example sensor for impedance measurement using a CTMU, according to examples of the present disclosure.

FIG. 2 is an illustration of an example sensor for impedance measurement using a CTMU, according to examples of the present disclosure.

A voltage source in the form of a square pulse wave from the GPIO port of the microcontroller may be received. This square wave pulse may be applied to a voltage input of the sensor.

The sensor may include a bridge configuration of a first branch and a second branch. Each branch may include a series circuit of a capacitor followed by a resistor. A voltage output may be produced from a midpoint of each branch. For example, $AN_x$ and $AN_y$ may be produced from each branch. $AN_x$ and $AN_y$ may be provided to CTMU or to instrumentation.

The resistor of each branch may have a same designed resistance. Variations may exist between the two resistors based upon manufacturing tolerances and variations.

The first branch may include a reference capacitor of a known value. The reference capacitor may be referred to as $C_x$.

The second branch may include a sensor capacitor with a variable capacitance. The sensor capacitor may be referred to as $C_{SENSE}$. The capacitance of $C_{SENSE}$ may vary according to a measured phenomenon, such as humidity. For example, the capacitance of $C_{SENSE}$ may be 0 pF at 5% relative humidity or less and may be 30 pF at 100% relative humidity.

In some examples, not shown, a current sink rather than a current source may be used. In such examples, the position of the $C_{SENSE}$ and the corresponding resistor in the second branch may be reversed. Similarly, the position of the reference capacitor and the corresponding resistor in the first branch may be reversed. In some examples, not shown, resistors $R_X$ may be coupled to a common potential other than ground wherein the GPIO port operates as a current sink rather than a source.

Figure 3:
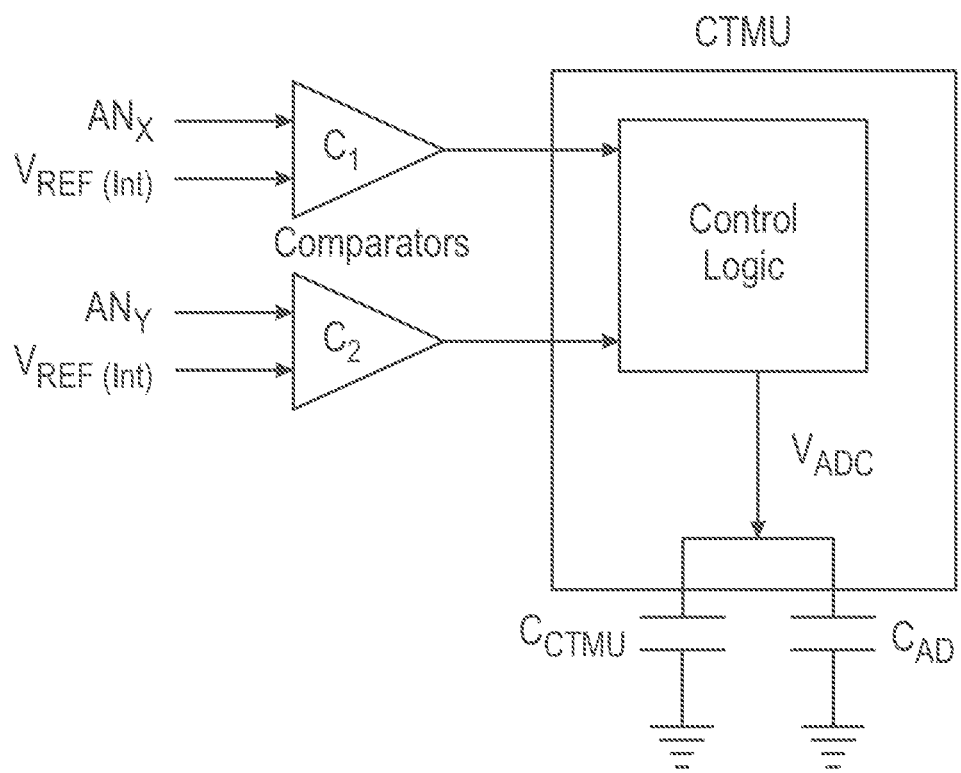
FIG. 3 is a more detailed illustration of a CTMU, according to examples of the present disclosure.

FIG. 3 is a more detailed illustration of a CTMU, according to examples of the present disclosure.

The $AN_x$ and $AN_y$ signals may be received at comparators $C_1$ and $C_2$. Comparators $C_1$ and $C_2$ may be implemented in the sensor, in the microcontroller, the CTMU, in instrumentation between the sensor and the microcontroller or CTMU, or in any other suitable location. Each of $C_1$ and $C_2$ may compare $AN_x$ and $AN_y$, respectively, against a reference voltage. Any suitable reference voltage may be selected. The reference voltage may be generated internally to the microcontroller or CTMU, or may be provided to the microcontroller or CTMU.

Based upon the comparisons of $AN_x$ and $AN_y$ against the reference voltage, the CTMU (or control logic therein or in the microcontroller) may selectively apply the current source to charge the combination of the $C_{CTMU}$ and the $C_{AD}$. This is illustrated in more detail in FIG. 4.

Figure 4:
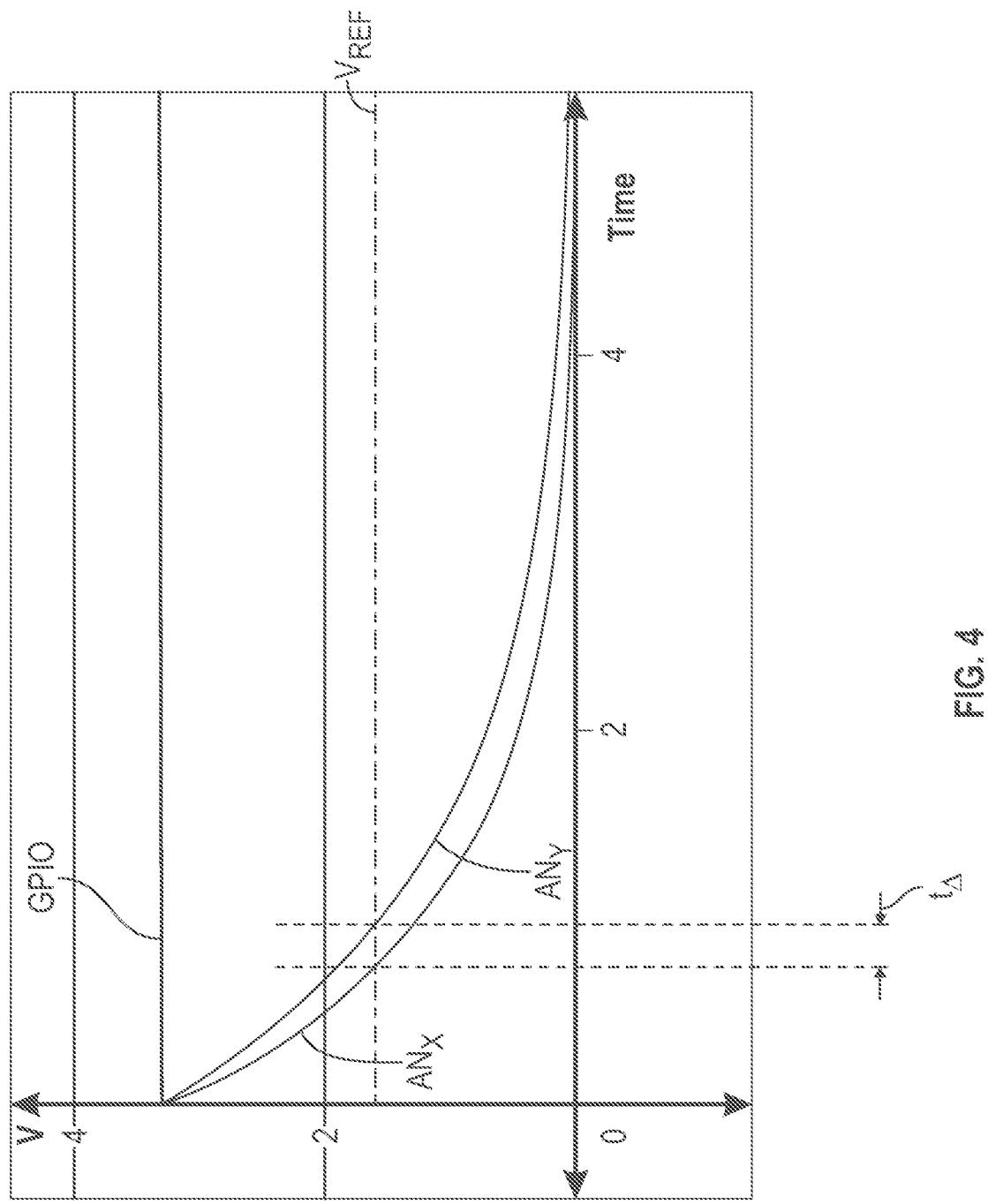
FIG. 4 is a timing diagram of measurements of the system, according to examples of the present disclosure.

FIG. 4 is a timing diagram of measurements of the system, according to examples of the present disclosure.

At time 0, the GPIO signal may be a logic one, providing a $V_{DD}$, such as 3.3 V, to the voltage input of the sensor. $C_X$ and $C_{SENSE}$ therein may begin charging. As these begin charging, and begin filling up, less and less current flows through the respective currents. Thus, the voltage at $AN_x$ and $AN_y$ becomes less and less. At some point, each of voltages $AN_x$ and $AN_y$ may be less than the reference voltage. Because the capacitance of $C_X$ is fixed, and $C_{SENSE}$ is a different capacitance and is variable, the time at which each of voltages $AN_x$ and $AN_y$ fall below the reference voltage may differ. The time at which each of voltages $AN_x$ and $AN_y$ fall below the reference voltage is in relation to the capacitance of each. Thus, the difference between the time at which each of voltages $AN_x$ and $AN_y$ fall below the reference voltage, given as delta-t, may be based upon a difference of the capacitances of $C_X$ and $C_{SENSE}$. As $C_{SENSE}$ varies with the phenomena to be measured, delta-t may be based upon the phenomena to be measured.

The CTMU circuit may measure this delta-t, and thus the difference in capacitances between $C_X$ and $C_{SENSE}$, and thus the phenomena to be measured itself. The CTMU circuit may measure this delta-t by using delta-t to enable and disable charging of capacitors $C_{CTMU}$ and $C_{AD}$. The amount of charge collected by $C_{CTMU}$ and $C_{AD}$ during this time period may result in a voltage measured by an ADC. The measured voltage may represent the delta-t and therefore the phenomena.

Figure 5:
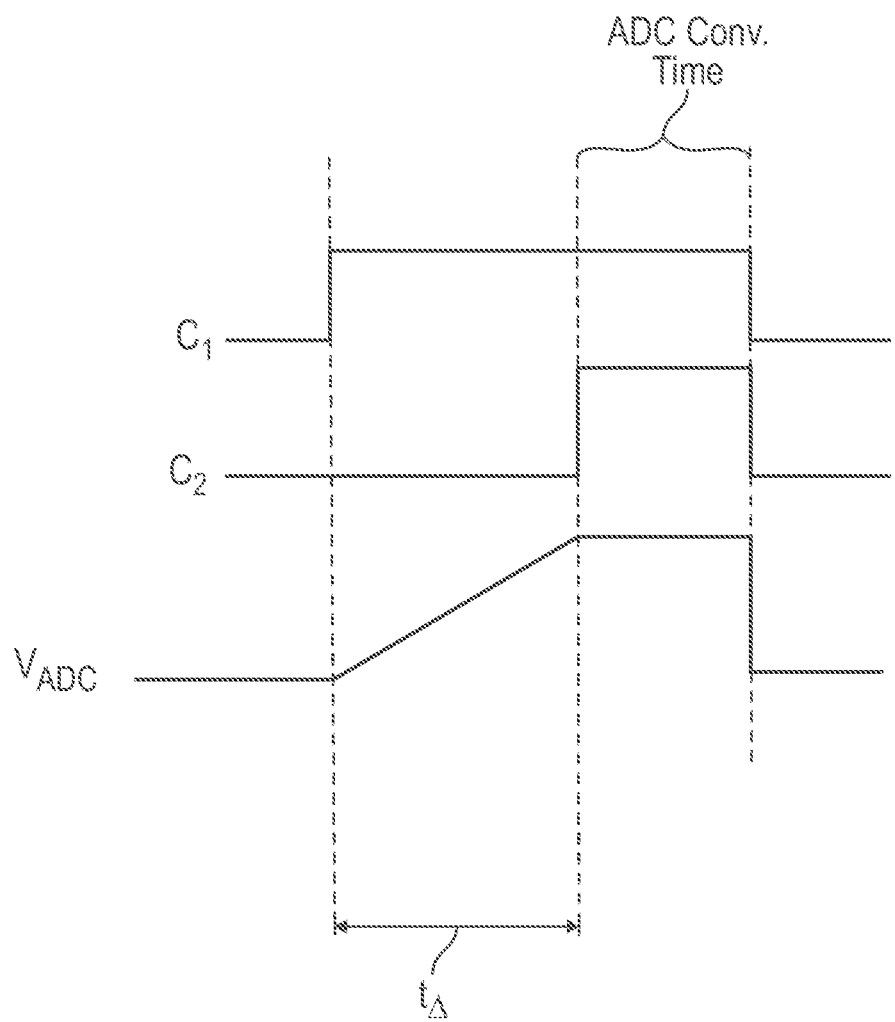
FIG. 5 is another timing diagram of measurements of the system, according to examples of the present disclosure.

FIG. 5 is another timing diagram of measurements of the system, according to examples of the present disclosure. FIG. 5 illustrates that the current source may be enabled, and the capacitors begin being charged, when $C_1$ indicates that $AN_x$ has fallen below the reference voltage. The current source may be disabled, and the capacitors may stop being charged, when $C_2$ subsequently indicates that $AN_y$ has fallen below the reference voltage. Thereafter, the charge stored in the capacitors may be measured by the CTMU circuit. This may be referred to as the ADC conversion time.

Figure 6:
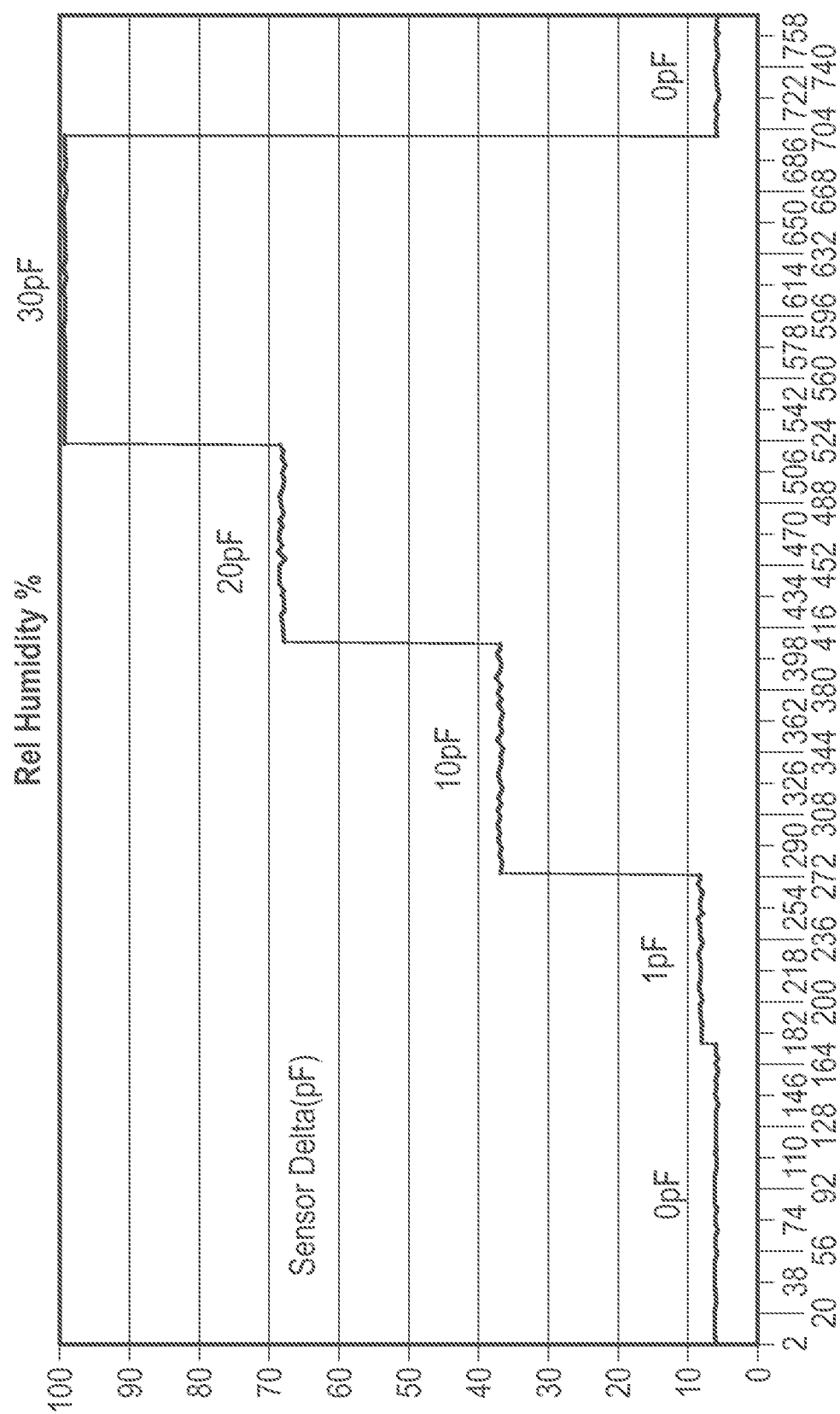
FIG. 6 is a timing diagram illustrating changes in capacitance with respect to measured relative humidity using the sensor, according to examples of the present disclosure.

FIG. 6 is a timing diagram illustrating changes in capacitance with respect to measured relative humidity using the sensor, according to examples of the present disclosure.

Figure 7:
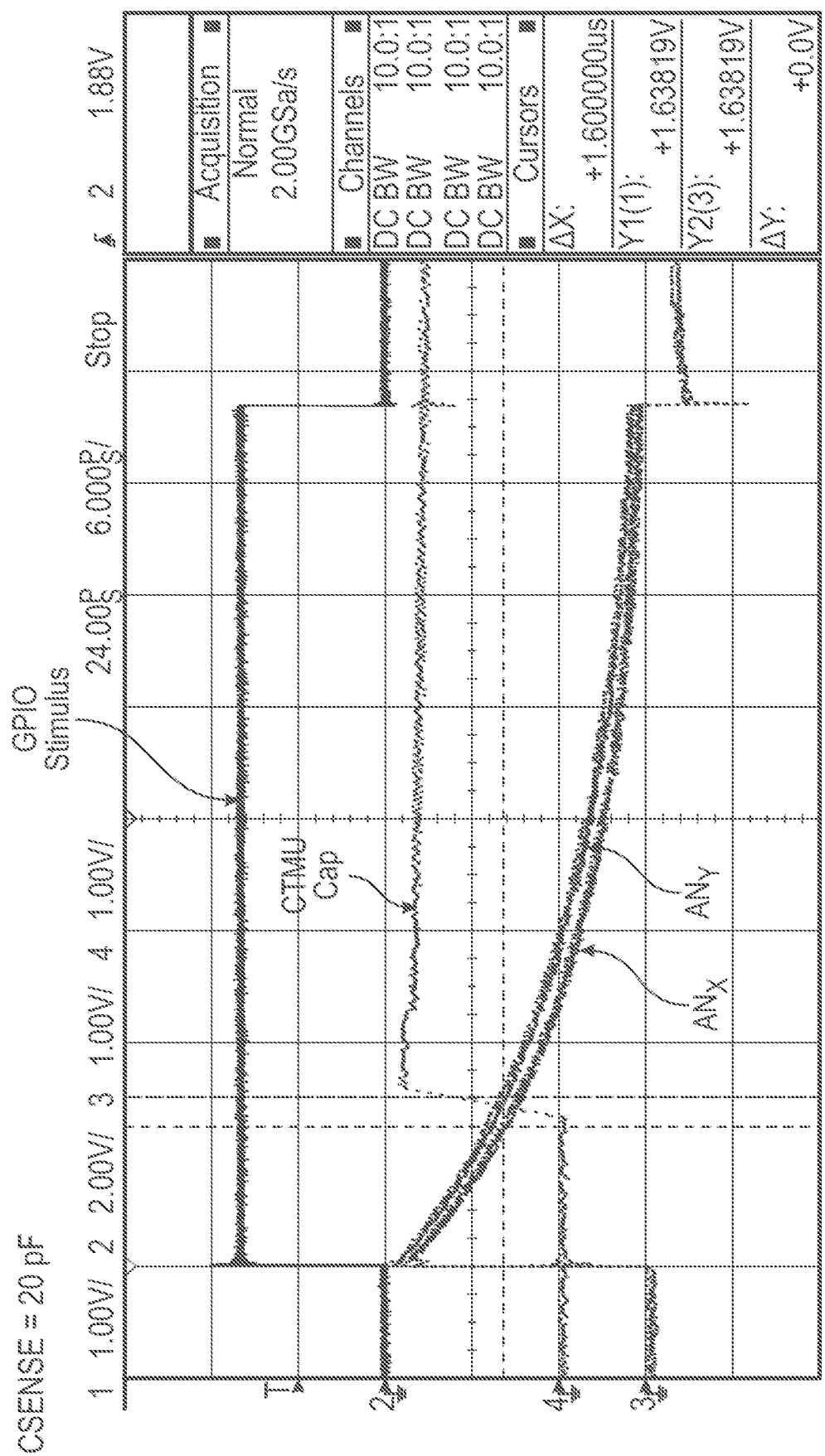
FIG. 7 is a timing diagram of measurements of the system for determining a 20 pF capacitance of the sensor, according to examples of the present disclosure.

FIG. 7 is a timing diagram of measurements of the system for determining a 20 pF capacitance of the sensor, according to examples of the present disclosure. The square wave of the GPIO stimulus triggers a change in the voltages $AN_x$ and $AN_y$. The voltage of the CTMU capacitor (CTMU Cap) begins to rise once $AN_x$ crosses the dashed reference voltage and stops rising once $AN_y$ crosses the dashed reference voltage.

Figure 8:
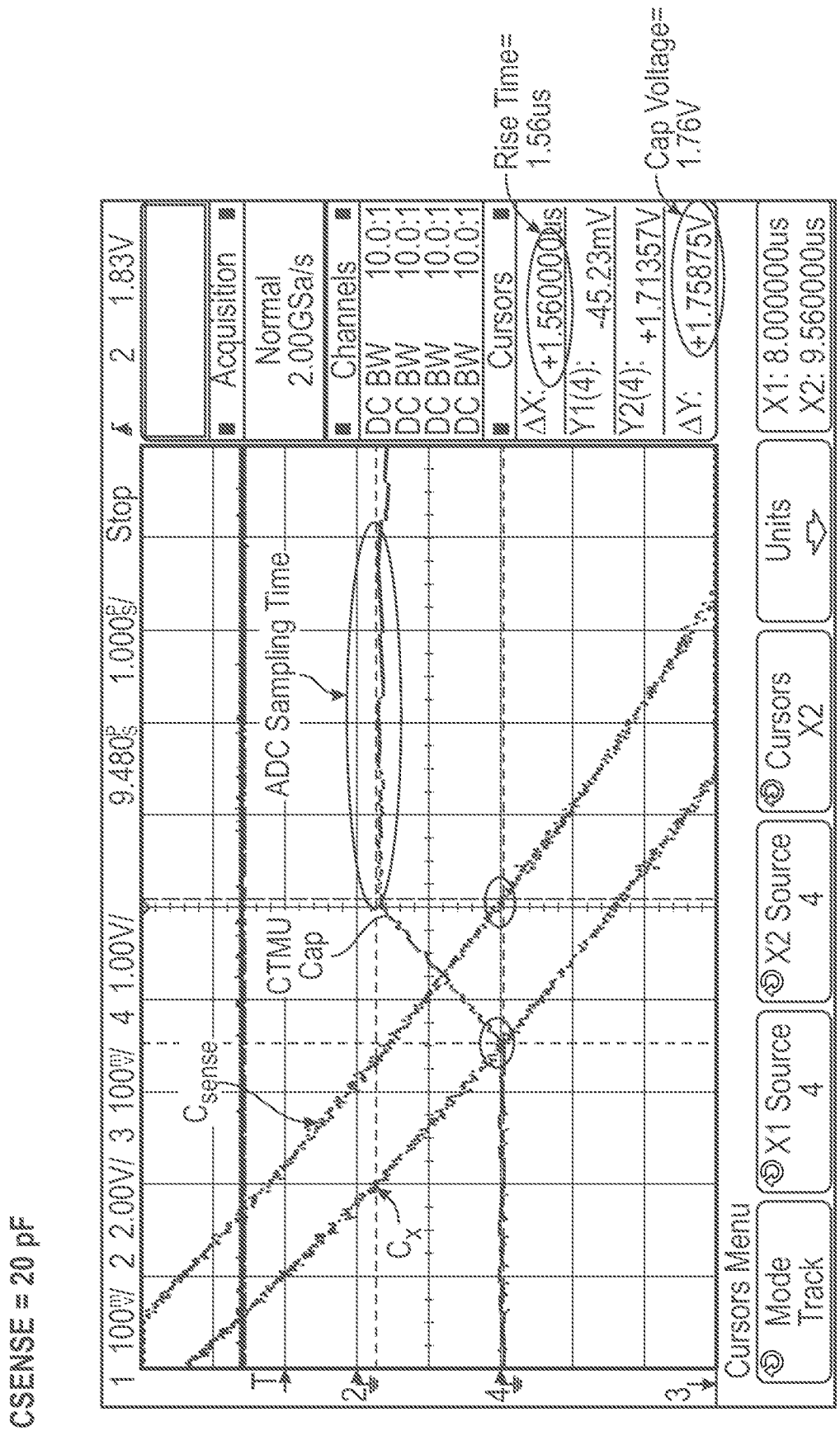
FIG. 8 is a more detailed timing diagram of measurements of the system for determining a 20 pF capacitance of the sensor, illustrating the ADC sampling time, according to examples of the present disclosure.

FIG. 8 is a more detailed timing diagram of measurements of the system for determining a 20 pF capacitance of the sensor, illustrating the ADC sampling time, according to examples of the present disclosure.

Figure 9:
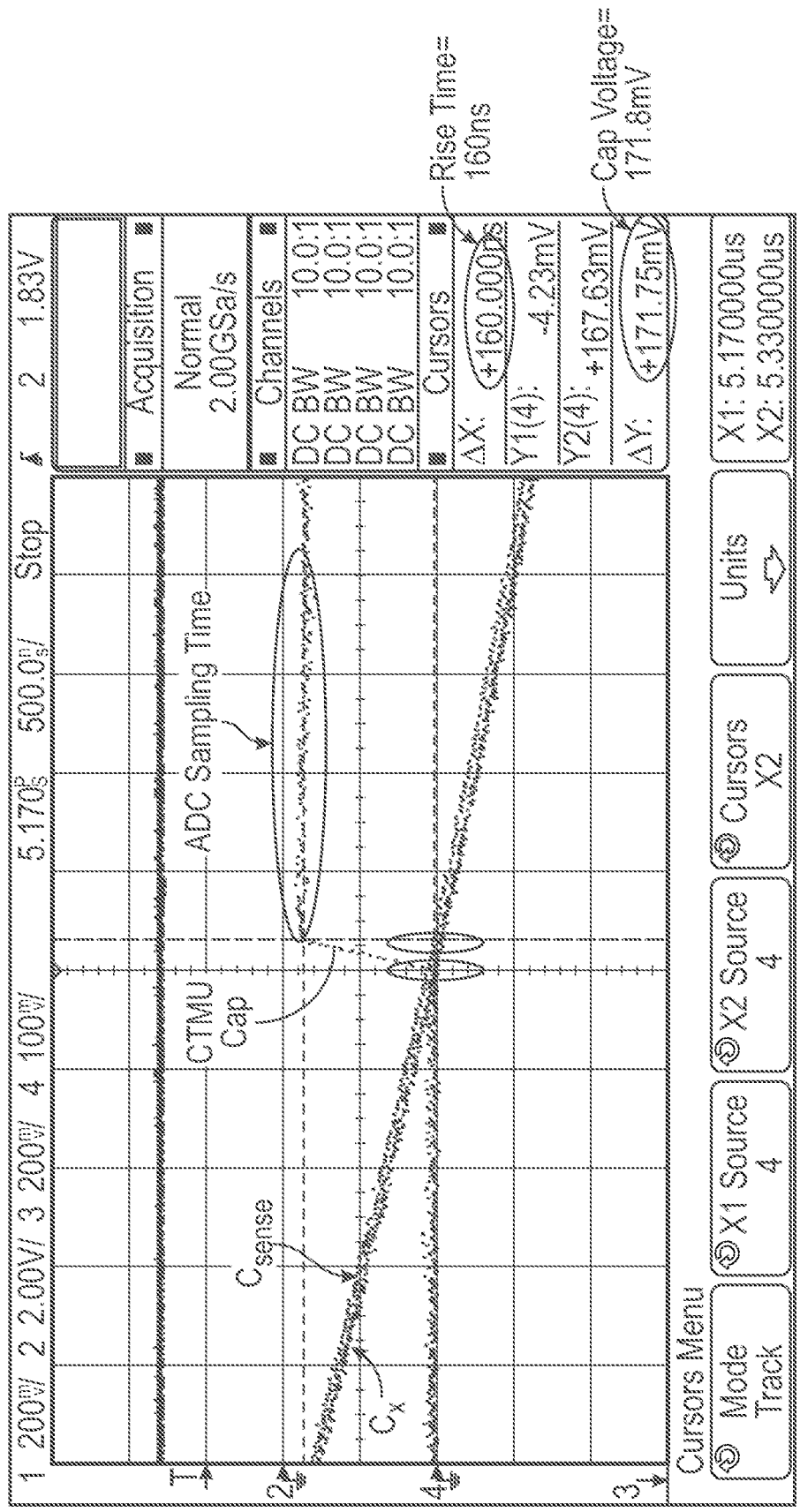
FIG. 9 is a timing diagram of measurements of the system for determining a 1 pF capacitance of the sensor, according to examples of the present disclosure.

FIG. 9 is a timing diagram of measurements of the system for determining a 1 pF capacitance of the sensor, according to examples of the present disclosure.

Thus, the impedance element to be measured is part of a passive bridge circuit. The bridge has all the reactive elements on the upper side. The purely resistive elements are located on the lower legs of the bridge (towards the ground connection) in order to allow the system to measure accurately the real value of the resistive elements of the bridge (thus maximizing the measurement precision). The stimulus is a digital pulse or other type of wave (e.g., sinewave). The reference reactive element of the bridge is precisely measured by using a known stimulus (e.g., a known pulse width). Since all the other bridge elements were precisely measured by the system, the unknown impedance is measured with a higher precision than the existing methods.

Examples of the disclosure use a novel passive circuit arrangement (reactive element located towards the stimulus and resistive element towards the ground connection) which allows the system to measure the actual real value of the resistive element in place and in turn determine precisely the reactive element in the circuit. They also use a bridge measurement method in order to avoid absolute measurements and use instead a differential, relative measurement method, better suited for precision results.

Examples of the disclosure are very low power and provide very high accuracy for a sensor. The CTMU circuit may trigger ADC operation. The CTMU circuit can discharge or short circuit the capacitors through control of the multiplexer through the reference resistor.

The difference between $C_X$ and $C_{SENSE}$ may be 160 pF at 0 percent humidity, and 195 pF at 100% humidity—a 35 pF differential spread. 160 pF is itself a relatively large value. In order to measure accurately this span of 35 pF we are using a $C_X$ that is around the baseline value of the humidity sensor. Approximately 150 pF, for example. We are able to measure all the capacitance values starting at 150 to 195, which expands the dynamic range of the measurement. There may be no need to measure the base value, but instead, the difference.

The resistors of the sensor may be about 100 kiloohms.

The time difference may be proportional to the difference in the capacitance between $C_X$ and $C_{SENSE}$. The time difference, delta-t, may be on the order of 100's of nanoseconds, or a few microseconds, at most. This kind of timing is hard to measure with high accuracy within a normal microcontroller. However, examples of the present disclosure may be able to measure this very small time difference with high precision through the charged value of the $C_{CTMU}$.

The lowest time difference of delta-t might be 10 ns, etc when $C_X$ and $C_{SENSE}$ are nearly same. At upper end of range of $C_{SENSE}$, delta-t might get 3 microseconds. The value of CAD may be used to expand the charge capacity to match the input range of the ADC of the CTMUI.

ADC conversion may be triggered by the CTMU circuit control logic. The CPU of the microcontroller may be interrupted and obtain the results.

The ADC conversion time may be longer than the delta-t, such as 1 microsecond. Notably, the 160 ns rise time is very difficult to be measured directly by a microcontroller. Instead, the ADC conversion may be performed relatively slowly. The sample time and ADC conversion time may thus be independent of rise time. Regardless of the capacitance difference, more work is not required by the microcontroller due to smaller capacitance changes and thus faster rise times.

As the resistors of the sensor may be imprecise, these may be characterized by the microcontroller in the calibration mode. The $AN_x$ or $AN_y$ signals may be connected to the current source. The voltage on that resistor may be measured. Thus the real value of $R_x$ in each branch may be determined, whether in terms of absolute or relative resistance, which may be used to finely adjust the resultant measurements.

Figure 10:
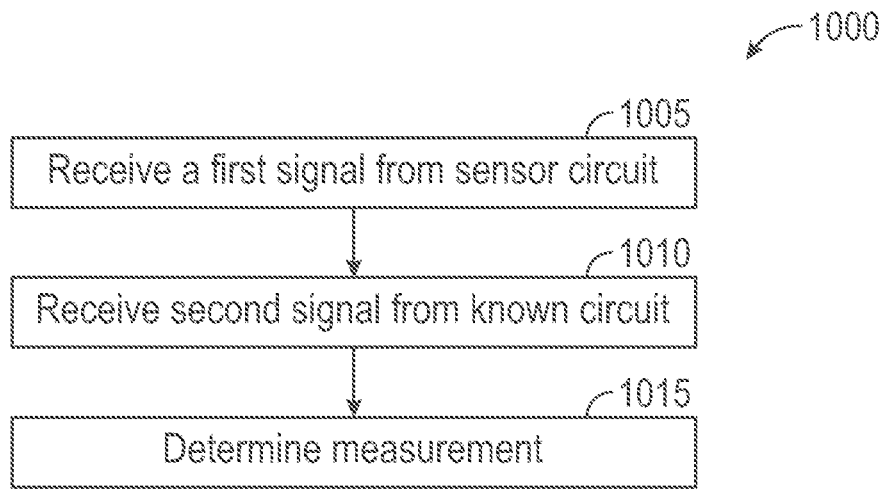
FIG. 10 is an illustration of a method for determining a measurement, according to examples of the present disclosure.
Figure 11:
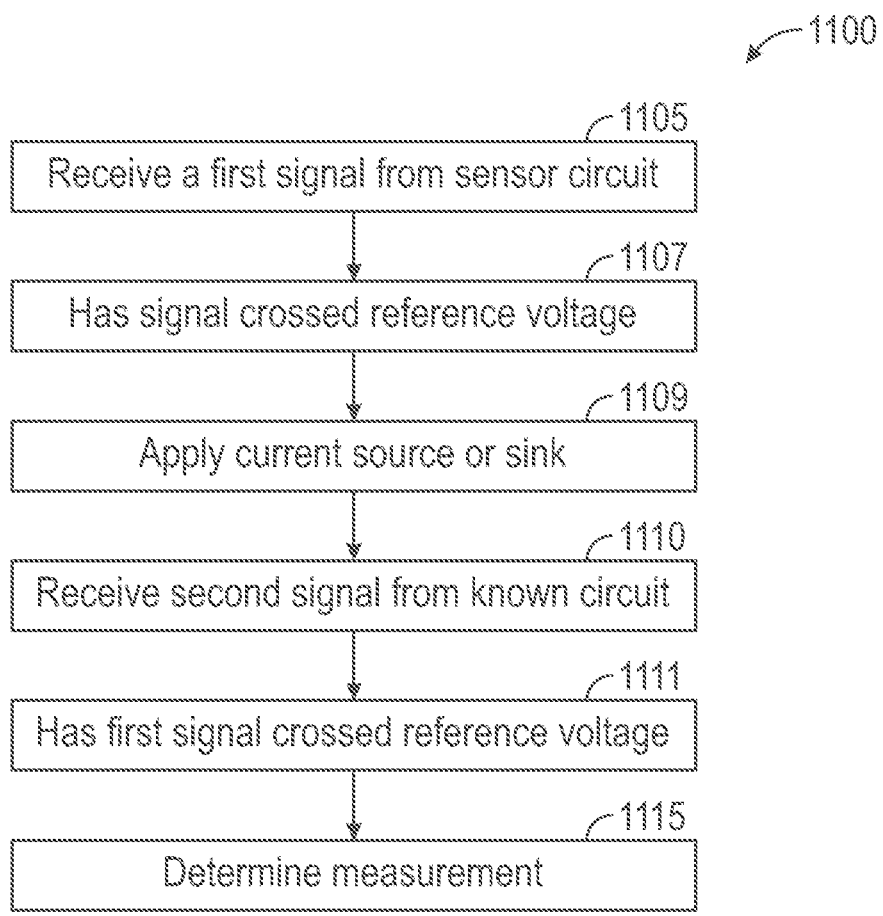
FIG. 11 is an illustration of a method for determining a measurement, according to examples of the present disclosure.

FIG. 10 is an illustration of a method for determining a measurement, according to examples of the present disclosure. Method 1000 begins with block 1005 for receiving a first signal from a sensor circuit. Block 1005 may be inputting a voltage at a microcontroller input from an external sensor circuit having an unknown impedance. Method 1000 continues with block 1010 for receiving a second signal from a sensor circuit. Block 1010 may be inputting a voltage at a second microcontroller input from a second external circuit having a known resistance and known impedance. The microcontroller may apply a current source or current sink to the second external circuit. Method 1000 continues with block 1015 for determining a measurement of the unknown impedance. Block 1015 may be a sampling of a voltage of the second external circuit to determine how long the current source or current sink has FIG. 11 is an illustration of a method for determining a measurement, according to examples of the present disclosure.

The system may be implemented in any suitable manner, such as by a device, die, chip, analog circuitry, digital circuitry, instructions for execution by a processor, or any combination thereof. The system may be implemented by, for example, a microcontroller and a sensor. Although some portions of the system are described herein as implemented by the microcontroller, such portions may be implemented instead by the sensor or by instrumentation coupling the microcontroller and the sensor. Similarly, although some portions of the system are described herein as implemented by the sensor, such portions may be implemented instead by the microcontroller or by instrumentation coupling the microcontroller and the sensor. Moreover, instead of a microcontroller, the system may be implemented by a server, computer, laptop, or any other suitable electronic device or system.

Although example embodiments have been described above, other variations and embodiments may be made from this disclosure without departing from the spirit and scope of these embodiments.

What is claimed is:

1. An apparatus, comprising:
   a first input to receive a first signal generated by a first portion of a sensor circuit, the first portion of the sensor circuit comprising an unknown impedance and a first known resistance, the unknown impedance to vary based upon a phenomenon to be measured by the sensor circuit;
   a second input to receive a second signal generated by a second portion of the sensor circuit, the second portion of the sensor circuit comprising a known impedance and a second known resistance; and
   a charge time measurement unit (CTMU) circuit to, based on a difference in time at which each of the first input and the second input reach a reference voltage, determine a measurement of the sensor circuit.

2. The apparatus of claim 1, wherein the CTMU circuit is to, in order to determine the measurement of the sensor circuit based on the difference in time at which each of the first input and the second input reach the reference voltage:
   apply a current source or sink to a reference capacitor based on a determination that either the first input or the second input has reached the reference voltage;

remove the current source or sink from the reference capacitor based on a determination that the other of the first input and the second input has reached the reference voltage; and determine the measurement of the sensor circuit based upon a voltage of the reference capacitor after application then removal of the current source or sink to the reference capacitor.

3. The apparatus of claim 2, wherein the CTMU circuit causes an analog to digital converter to measure the voltage of the reference capacitor in order to determine the measurement of the sensor circuit based on the difference of time at which each of the first input and the second input reach the reference voltage.

4. The apparatus of claim 2, wherein a hold time to determine the voltage of the reference capacitor is independent of the time the current source or sink was applied to the reference capacitor.

5. The apparatus of claim 1, wherein:
the unknown impedance is a sensor with a variable capacitance that varies based upon the phenomenon to be measured;
the first known resistance is coupled to a common potential;
the known impedance is a reference capacitor with a fixed capacitance; and
the second known resistance is coupled to the common potential.

6. The apparatus of claim 5, wherein the difference in time at which each of the first input and the second input reach the reference voltage is based upon a difference between the variable capacitance and the fixed capacitance.

7. The apparatus of claim 1, wherein the CTMU circuit is to issue a sensor input voltage to the sensor circuit to cause the first signal and the second signal to change to reach the reference voltage.

8. The apparatus of claim 1, wherein the CTMU circuit is to issue a sensor input voltage to the sensor circuit to cause the sensor circuit to:
begin charging or discharging the unknown impedance to generate the first signal; and
begin charging or discharging the known impedance to generate the second signal.

9. A method for measuring an unknown and variable impedance comprising:
receiving a first signal generated by a first portion of a sensor circuit, the first portion of the sensor circuit comprising the unknown and variable impedance and a first known resistance, the unknown and variable impedance to vary based upon a phenomenon to be measured,
receiving a second signal generated by a second portion of the sensor circuit, the second portion of the sensor circuit comprising a known impedance and a second known resistance, and
determining, based on a difference in time at which each of the first signal and the second signal reach a reference voltage, a measurement of the sensor circuit.

10. The method for measuring an unknown and variable impedance of claim 9 comprising:
when either the first signal or the second signal reaches the reference voltage, begin applying a current source or a sink with a known current to a timing capacitor with a known capacitance; and
when the other of the first signal or the second signal reaches the reference voltage, terminate application of the current source or sink to the timing capacitor;
wherein the step of determining a measurement of the sensor circuit is based on the resultant voltage of the timing capacitor.

11. The method for measuring an unknown and variable impedance of claim 10 comprising:
measuring a voltage of the timing capacitor in order to determine the measurement of the sensor circuit.

12. The method for measuring an unknown and variable impedance of claim 11 wherein the hold time for measuring the voltage of the timing capacitor is independent of the time the current source was applied to the timing capacitor.

13. The method for measuring an unknown and variable impedance of claim 9 wherein:
the unknown impedance is a humidity sensor with a variable capacitance that varies based upon the humidity of the air around the humidity sensor;
the first known resistance is coupled to a common potential;
the known impedance is a reference capacitor with a fixed capacitance; and
the second known resistance is coupled to the common potential.

14. The method for measuring an unknown and variable impedance of claim 13 wherein the difference in time at which each of the first signal and the second signal reach the reference voltage is based upon a difference between the variable capacitance and the fixed capacitance.

15. The method for measuring an unknown and variable impedance of claim 9, comprising issuing a sensor input voltage to the sensor circuit to cause the first signal and the second signal to change to reach the reference voltage.

16. The method for measuring an unknown and variable impedance of claim 15, wherein the unknown and variable impedance is a sensor with a variable capacitance that varies based upon the phenomenon to be measured, the method comprising:
begin charging or discharging the variable capacitor to generate the first signal, the variable capacitor to vary based upon the phenomenon to be measured by the sensor circuit; and
begin charging or discharging a sensor reference capacitance to generate the second signal.

17. A sensing apparatus to measure a phenomenon, comprising:
a voltage input to receive a pulsed input direct current (DC) voltage;
a bridge sensor circuit including:
a first bridge leg circuit including a variable impedance component, the variable impedance component including an impedance, which varies based upon the phenomenon, coupled at a first output to a first reference resistance connected in series with the variable impedance component, and
a second bridge leg circuit including a reference impedance component coupled at a second output to a second reference resistance connected in series with the reference impedance component;
a first comparator coupled to the first output and a reference voltage; and
a second comparator coupled to the second output and the reference voltage;
wherein a combination of an output of the first comparator and an output of the second comparator represent a measurement of the phenomenon.

18. The sensing apparatus of claim 17 to measure a phenomenon, wherein:
the variable impedance component is a variable capacitor;
the first reference resistance is connected in series between the variable capacitor and ground;
the reference impedance component is a reference capacitor; and
the second reference resistance is connected in series between the reference capacitor and ground.

19. The sensing apparatus of claim 17 to measure a phenomenon, wherein:
the output of the first comparator is coupled to a timing circuit;
the output of the second comparator is coupled to the timing circuit; and
the timing circuit to measure a time between a first change in one of the two comparator outputs and a second change in the other of the two comparator outputs, wherein the time represents a measurement of the phenomenon.

20. The sensing apparatus of claim 17 to measure a phenomenon, wherein:
the output of the first comparator is coupled to a timing circuit;
the output of the second comparator is coupled to the timing circuit; and
the timing circuit to measure a time between a first change in one of the two comparator outputs and a second change in the other of the two comparator outputs, wherein the time represents a measurement of the phenomenon.

* * * * *